(12) United States Patent
Lydon et al.

(10) Patent No.: US 6,225,136 B1
(45) Date of Patent: May 1, 2001

(54) METHOD OF PRODUCING A CONTAMINATED WAFER

(75) Inventors: Justin R. Lydon, Battle Ground; Brian L. Tansy, Vancouver, both of WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/383,041

(22) Filed: Aug. 25, 1999

(51) Int. Cl.$^7$ .................. G01N 23/223; G01N 21/64; H01L 21/66
(52) U.S. Cl. .................. 438/14; 438/16; 356/243.1; 356/243.3; 356/243.6; 378/48
(58) Field of Search .................. 438/14, 16; 356/243.1, 356/243.4, 243.6; 378/48; 250/252.1

(56) References Cited

PUBLICATIONS

Hourai et al., Jpn. J. Appl. Phys., vol. 27, No. 12, pp. L2361–L2363, Dec., 1988.*

Kondo et al., Jpn. J. Appl. Phys., vol. 31, No. 1A/B, pp. L11–L13, Jan., 1992*

Tadros et al., Electroanalytical Chemistry and Interfacial Electrochemistry, vol. 17, pp. 267–275, 1968.*

* cited by examiner

Primary Examiner—Fred J. Parker
Assistant Examiner—Michael Cleveland
(74) Attorney, Agent, or Firm—Kolisch, Hartwell, Dickinson, McCormack & Heuser

(57) ABSTRACT

A method of controllably adding at least one contaminant to a surface of a silicon wafer. The method includes providing a solution containing a known concentration of one or more contaminants and having a known pH. The solution is applied to a surface of a silicon wafer and allowed to remain there for a predetermined period of time so that the one or more contaminants adsorb to the wafer surface. The solution is then removed while leaving the adsorbed one or more contaminants on the surface.

10 Claims, 3 Drawing Sheets

METHOD OF PRODUCING A CONTAMINATED WAFER

TECHNICAL FIELD

The present invention relates generally to the production of contaminated silicon wafers. More particularly, it concerns a method for controllably and reproducibly contaminating the surfaces of silicon wafers with one or more impurities for such uses as analytical standards and experimental substrates.

BACKGROUND OF THE INVENTION

The production of silicon wafers for integrated circuit substrates requires the use of complex processes involving many mechanical and chemical steps. Achieving a high degree of purity of the ultimate product is one of the most important concerns in the process, because the presence of too high a concentration of contaminants in or on a wafer may adversely affect the performance of circuits fabricated on that wafer. Beginning with a raw material such as quartzite, the impurity level of the silicon is typically reduced by eight or more orders of magnitude before the final silicon wafer is ready for shipment. Quartzite has relatively high impurity levels; for instance, it may contain aluminum levels of approximately $3\times10^{20}$ atoms/cm$^3$. Through a series of chemical steps, this concentration may be reduced to the $10^{12}$ range. The final ultra-pure product is referred to as electrical grade polycrystalline silicon (EGS), and may be formed into a single crystal ingot from which wafers are cut. Once this high purity has been achieved, it is important that the purity is not compromised in the later wafer cutting, shaping and polishing processes.

The mechanical and chemical steps involved in the wafer production process present many opportunities for the introduction of impurities onto the surfaces of the wafers. A typical process is as follows: Before wafers are cut from the ingot, the ingot itself is shaped. Industrial grade diamond grinding wheels are used to form the ingot into a uniform cylindrical shape. A similar grinding tool is then used to introduce a primary flat along one side of the ingot. This flat is used by later processing equipment to align wafers in the equipment and is also used as a crystallographic reference. Next individual wafers are cut from the ingot using a stainless steel blade with diamond particles bonded to the edge. Some degree of inconsistency exists in the thickness of the newly cut wafers, so a lapping and grinding step is used to correct variations in the thickness of the wafers. This step uses a polishing compound, such as an $Al_2O_3$ and glycerin mixture, with which the wafer is mechanically reduced to the correct thickness. After these machining steps, the surface may contain some degree of damage and contamination, so a wet etching step is used to clean and smooth the surface. Typically, a solution of nitric, hydrofluoric and acetic acids is used as the etching solution. After etching, a polished surface is created on one side of the wafer through a mechanical-chemical process that uses a slurry of very fine silica powder and sodium hydroxide. The process may end here, or epitaxial layers may be applied to the surface of the silicon wafer. To ensure wafer quality throughout the manufacturing process, the purity of the wafer surfaces may be measured after each processing step. The final wafer ideally should have a surface contamination concentration of no more than approximately $10^{10}$ impurity atoms/cm$^2$.

Several common techniques exist for measuring the purity of wafer surfaces. One widely used technique is known as total reflection x-ray fluorescence spectroscopy, or TXRF. TXRF is a nondestructive technique that measures the x-ray fluorescence from surface impurity atoms resulting from excitation caused by an incident x-ray beam. Because it is non-destructive, it can be used to test wafers that are in production. Another common technique is Vapor Phase Decomposition Graphite Furnace Atomic Absorption spectroscopy (VPDGFAAS). In this technique, a chemical treatment is used to decompose the surface layer of a wafer, after which a sample is extracted from the decomposed layer and vaporized in a graphite furnace for standard atomic absorption analysis.

These tests use machines that must be calibrated before quantitative measurements may be made. The calibration process serves various purposes. For TXRF, the calibration process is used to verify that the instrument has not gone out of calibration since the last measurements were made. When used to quantitatively analyze an experimental wafer for contaminants, TXRF techniques typically make a measurement directly on the wafer surface. Any standard used to calibrate this measurement should be of a similar sample type, and should fit in the same machine as the experimental samples. Therefore, a good standard to use for TXRF machine calibration when performing measurements on silicon wafers is an intentionally contaminated silicon wafer.

Intentionally contaminated silicon wafers have other experimental uses as well. For instance, the contaminated wafers may be used with techniques such as VPDGFAAS to verify that the sample collection process is reproducibly extracting samples for measurements. This may be done by first performing the sample extraction technique on an intentionally contaminated wafer, measuring the extracted impurity levels, and then comparing the experimental results to the known contamination level of the wafer. Another example of a use for intentionally contaminated wafers is in gettering experiments. During the processing of integrated circuits, unintentional contamination can occur in many different steps of production. Gettering techniques are used to draw these contaminants away from working areas of the circuits. To obtain accurate quantitative information on the effectiveness of a gettering technique, experiments must be performed on intentionally contaminated wafers with known levels of impurities to measure the quantity of impurities drawn away from the surface by the technique.

Yet another example of a use for intentionally contaminated wafers is in the study of the effects of contaminants on circuit performance. To maximize efficiency in these applications, it is desirable to have wafers with controlled concentrations of more than one impurity. This also allows the study of the effects of multi-elemental contamination on various circuit performance characteristics or fabrication processes.

A common problem that arises in the production of intentionally contaminated wafers concerns the distribution of contaminants on the surface of a wafer. It is desirable to have a high degree of uniformity of contaminant concentrations on the surface to reduce the dependency of a given measurement technique on the position of a detector. Some techniques for contaminating wafers involve dripping a very small quantity of solution containing a known or calculable number of impurity atoms onto the surface of a wafer and then drying the solution. These techniques result in small, localized areas of contamination, and require much care to be taken in positioning a detector when measuring the contamination. The ambient chosen for sample drying can further change the distribution of atoms on the surface due to thermal migration or diffusion, thereby decreasing the predictability and reproducibility of the techniques. These techniques are also not suitable for making wafers for gettering or circuit design studies, as the contamination exists only on small, discrete areas of the surface.

Other techniques involve exposing substantially all of a wafer surface to a contaminant solution and drying the contaminants onto the surface. These techniques reduce the position sensitivity problems, but other problems arise with the controllability of the concentration of contaminants that adsorb to the surface. The amount of contaminant that will adsorb to a wafer surface is dependent upon the interaction between the wafer surface and the contaminant atoms, and may not always be varied by simply changing the concentration of contaminants in the solution.

Many contaminants adsorb to the wafer surface by physiadsorption, a low energy interaction between a contaminant atom on the surface of a wafer and the surface atoms of the wafer itself. Physiadsorption is readily reversible, and occurs when local areas of electrical polarization allow a weak electrostatic attraction to occur between the surface and the contaminant. The quantity of atoms that physiadsorb to a surface may be a function of the number of contaminant species in the solution, the concentration of each species, the free energy of each adsorption reaction, and the effect the solution has on the surface properties of the wafer. Thus, the concentration of contaminant species that adsorbs to a wafer surface is not necessarily a function only of the concentration of contaminants in the solution. Increasing or decreasing the contaminant level in the solution may have little or no effect on the resulting surface contamination level. As a result, problems are encountered both in controllably contaminating wafer surfaces, and in identifying the correct procedure to follow to determine the best solution composition.

SUMMARY OF THE INVENTION

One aspect of the present invention provides a method of controllably adding at least one contaminant to a surface of a silicon wafer, the surface having a surface charge. The method includes providing a solution containing a known concentration of at least one contaminant and having a known pH; applying the solution to the surface; allowing the solution to remain on the surface for a predetermined period of time so that the surface charge of the surface is at least partially controlled by the pH of the solution, and so that the at least one contaminant adsorbs to the surface in a concentration at least partially controlled by the surface charge; and removing the solution while leaving the contaminant on the surface.

Another aspect of the present invention provides a method of controllably adding at least one contaminant to a surface of a silicon wafer. The method includes providing a solution with a known concentration of at least one contaminant and a known concentration of an acid; applying the solution to the surface; waiting for a predetermined period of time so that the acid and the at least one contaminant competitively adsorb to the surface in an equilibrium concentration; and removing the solution while leaving the equilibrium concentration of the at least one contaminant adsorbed to the surface of the silicon wafer.

DETAILED DESCRIPTION AND BEST MODE FOR CARRYING OUT THE INVENTION

Figure 1:
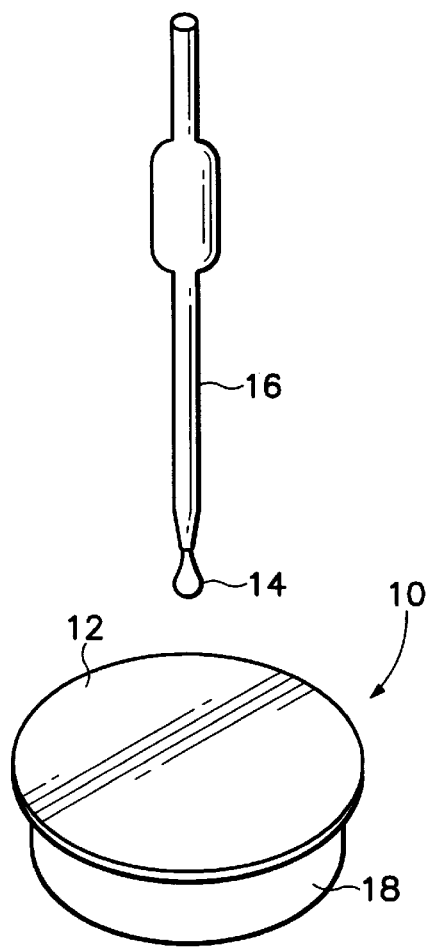
FIG. 1 is a top isometric view of apparatus suitable for carrying out an embodiment of the present invention.

The present invention provides a method of controllably contaminating the surface of a silicon wafer that avoids the problems of prior techniques. FIG. 1 shows generally a schematic of an apparatus that may be used to practice the present invention. A silicon wafer is indicated at 10. The wafer has a surface 12 onto which a solution 14 is applied through the use of an applicator 16. The solution contains one or more contaminants and an acid. While the applicator shown here is a pipette, any suitable method of transferring a liquid onto a wafer surface may be used. A solution removal device is shown at 18. Here, it is shown as a spin processor, but the solvent may be removed by other suitable means, such as directing a stream of a gas over the wafer to expedite the evaporation of the solution.

The solution 14 will generally be an aqueous solution. Water may be used alone as a solvent, or one or more miscible solvents, such as methanol or ethanol, may be added to the water to change the solvent properties as desired. Aqueous solutions are preferable for this invention because they completely wet the silicon wafer surface, permitting a thin, uniform coating of solution to be applied to the wafer surface with little difficulty. The solution also contains a concentration of one or more contaminants. Though any contaminant that is desired may be added to the solution, the most common contaminants are cations of various metals. This is because the various cutting and polishing steps in wafer production use metal equipment or metal oxide polishing compounds, and give rise to the possibility that metal contaminants will be left behind on the surface. Thus, the metals used as contaminants are those commonly tested for in the wafer production process and include Al, Ca, Cu, Cr, Fe, Na, Ni and Zn. Typically, the concentration of the contaminant in the solution will be in the parts per billion (ppb) range. To accurately determine this concentration, it is best to begin with a standard solution such as those available from the National Institute of Standards and Technology (NIST), and use serial dilutions to reduce the concentration to the desired level.

An acid is also added to the solution. Either a strong or a weak acid may be used. An example of a suitable strong acid is nitric acid. The acid is used to control the amount of contaminant that adsorbs to the wafer surface. Typically, the surface of a silicon wafer consists of a thin layer of the oxide $SiO_2$. The Si—O bonds of this oxide layer are polar, and because oxygen is a more electronegative element than silicon, the more negative ends of the dipoles are found on the oxygen atoms. Because of this, positively charged species may electrostatically bond to these oxygen atoms. Before a wafer surface is exposed to the contaminant solution, the oxygen atoms generally have electrostatically bonded terminal hydrogen ions. The interaction between the oxygen atoms and the hydrogen ions is a weak physiadsorption, and the hydrogen ions may be readily exchanged with other positively charged species by exposing the surface to a contaminant solution containing such species.

The mechanism by which the acid controls the amount of metal adsorbed to the surface can be described in two ways, depending on whether the adsorption is considered from a microscopic or macroscopic standpoint. From a microscopic standpoint, the acid and the metal ion are in direct competition for exchange with the hydrogen ions that are electrostatically bonded to the $SiO_2$ surface. In an aqueous acidic contaminant solution, the acidic species in solution is the hydronium ion, or $H_3O^+$, which may be represented more simply as a hydrogen ion, $H^+$. The metal species may be represented as $M^+$. The exchange reaction between the hydrogen ions and metal ions on the $SiO_2$ surface may then be written as:

(1)

Because the contaminant solution contains only a small concentration of contaminant metal ions, the acidic species will exist in a concentration far greater than the concentration of metal ions. Thus, protons will occupy most surface sites. However, a small equilibrium concentration of adsorbed metal cations will also exist; in a quantity dependant upon the free energy of the metal adsorption reaction compared to that of the proton adsorption, and the relative concentrations of the acid and the contaminant in the solution. This equilibrium concentration may be expressed by the following equation:

$$K=[SiO^-M^+][H^+]/[SiO^-H^+][M^+] \quad (2)$$

where K is the equilibrium constant of the reaction, and the brackets represent the concentrations of each species in the reaction. By rearranging the equilibrium expression, the equation can be written as follows:

$$[SiO^-M^+]=[SiO^-H^+][M^+]/[H^+]*K \quad (3)$$

From equation (3), it is evident that as the concentration of hydrogen ions in the contaminant solution is increased, the concentration of metal ions adsorbed to the wafer surface will decrease. Therefore, if more acid is added to the solution, the number of surface sites to which the hydrogen ions adsorb will increase, and the number of surface sites available for metal cation adsorption will decrease. Conversely, decreasing the amount of acid in the solution will decrease the number of surface sites at which hydrogen ions adsorb, and result in an increase of the adsorption of metal atoms.

From a macroscopic viewpoint, the mechanism for the control of the adsorption of metal ions to a wafer surface can be described in terms of the surface charge of the wafers. Silicon wafers, because of the polarity of the Si—O bonds, have a surface charge, commonly expressed in coulombs per square centimeter, that can be measured through known techniques. The surface charge of a silicon wafer will normally be negative. The magnitude of the surface charge will control the adsorption properties of the wafer surface; for instance, a more negatively charged surface may adsorb a greater quantity of positively charged ions. Likewise, a less negatively charged surface may adsorb fewer positively charged ions. The magnitude of the surface charge is affected by its surrounding environment. If the wafer surface is exposed to an acidic solution, the positively charged protons in the solution will adsorb to the negatively charged wafer surface and reduce the magnitude of the surface charge to some extent. Thus, the more acid that is added to the solution, the greater the reduction in the magnitude of the surface charge. As the magnitude of the surface charge is reduced, fewer positively charged contaminant atoms will adsorb to the surface. Therefore, by varying the pH of the solution, one can control the number of positively charged contaminant atoms that adsorb to the wafer surface. Though the pH may be adjusted to any level necessary, it is typically adjusted to a value between 0.5 and 3.

Figure 2:
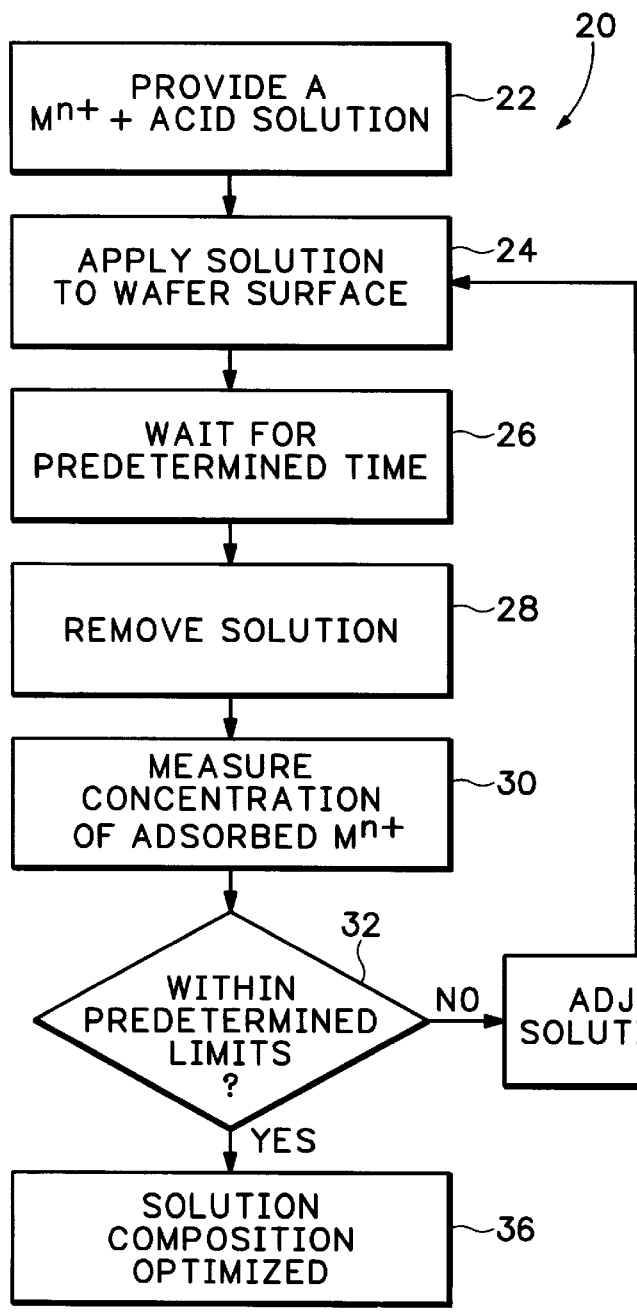
FIG. 2 is a flow diagram depicting a method for determining the composition of a contaminating solution according to the present invention

An iterative process, shown generally at 20 in FIG. 2, is used to adjust the solution to its optimum pH for causing the adsorption of a desired "target" concentration of contaminants. First, a solution containing an acid and some contaminant, shown at 22 to be a metal cation, is mixed. The contaminant will typically be mixed into the solution at a concentration somewhere in the ppb range for a target contamination level of approximately $10^{10}$ atoms/$cm^2$. Then, the solution is applied to the wafer surface at step 24. If uniformity is desired in the contamination, it is preferable to coat the entire surface with solution. After the solution has been applied to the surface, it is allowed to remain on the surface for a predetermined time, shown at 26. This is to allow the adsorbed atoms to reach an equilibrium concentration. A typical waiting period is five minutes. After waiting, the solution is removed at 28. It is best to use a removal process that results in the solution evaporating evenly on the surface of the wafer, as an uneven evaporation may result in a non-uniform concentration of contaminants. A spin-drying process using ordinary spin processing equipment is a preferred method of drying, as it spins off extra solution and results in the evaporation of a uniform layer of solution on the wafer surface. After the solution has been removed, the concentration of adsorbed contaminants is measured at 30 using a technique such as TXRF or VPDG-FAAS. The measured concentration is then compared to a target concentration at 32. If the measured concentration is within the predetermined limits of the target concentration, the solution composition has been optimized at 36. If, on the other hand, the measured concentration is not in the target range, then the pH of the solution is adjusted at 34, and the steps of applying the solution, waiting, removing the solution, measuring the contaminant level, and comparing the measured value to the target value are repeated with the adjusted pH solution. Generally, the adjusted pH solution is applied to a new wafer, rather than to the wafer contaminated in the first iteration. If the measured contaminant concentration on the wafer surface is too low, then the pH is increased by remixing the contaminant solution with less acid to increase the concentration of contaminants that will adsorb to the surface. Likewise, if the measured contaminant concentration on the wafer surface is too high, then the pH is lowered by remixing the solution with more acid, or by adding more acid to the existing solution, to decrease the concentration of contaminants that will adsorb to the surface. The relationship between the pH of the solution and the concentration of contaminants that bonds to the wafer surface is generally linear, and a calibration function may be calculated to assist in future contaminations.

Once the composition of the contaminant solution that yields the desired wafer contamination level has been determined, other wafers can be reproducibly contaminated using a substantially identical solution. The process for producing other contaminated wafers once an optimal solution composition has been determined is shown generally at 38 in FIG. 3. First, a volume of the optimal solution as determined in process 20 is mixed at 40. The solution is applied to the wafer surface at 42, allowed to equilibrate for a predetermined time at 44, and removed at 46. As long as the wafers used have been treated similarly to the wafer with which the solution was optimized, the resulting contaminant levels will be very reproducible. The contaminant level may be verified if desired using any suitable quantitative technique.

Figures 3, 4:
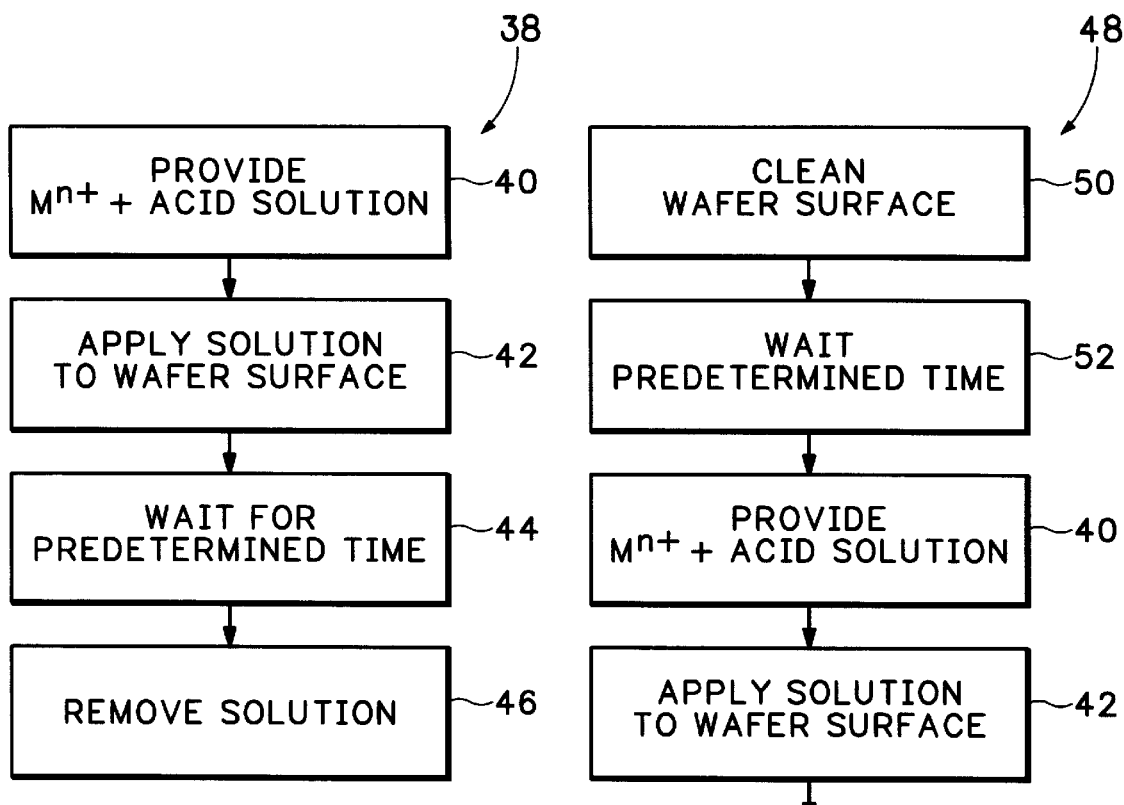
FIG. 3 is a flow diagram depicting a contaminated wafer production method according to an embodiment of the present invention.
FIG. 4 is a flow diagram depicting a contaminated wafer production method according to another embodiment of the present invention.

In order to ensure that the silicon wafers to be contaminated in process 38 will have the correct concentration of adsorbed contaminants after the process, the wafers may be cleaned before the contamination process. If cleaning is used, it is important that the same time interval is always allowed to pass between cleaning the wafer and exposing it to the contaminating solution to ensure that the surface is exposed to as few undesirable contaminants as possible before it is exposed to the contaminant solution. FIG. 4 shows generally at 48 a wafer-contaminating process that includes a wafer-cleaning step. Before the wafer is exposed to the contaminating solution, it is cleaned at 50. The cleaning process comprises several steps. First, an organic strip process may be used to remove any possible organic contaminants. The organic strip may be a multi-solvent cleaning process, or may be an oxidative process. An example of a multi-solvent organic stripping process would be a progressive cleaning first using trichloroethylene, then acetone, and then methanol. An example of an oxidative process would be exposing the wafer surface to an aqueous solution of sulfuric acid and hydrogen peroxide. After the organic strip, a standard cleaning process such as exposure to SC1 and SC2 baths may be used. In the SC1 bath process, the wafers are exposed to a basic solution containing ammonium hydroxide and hydrogen peroxide at a temperature of around 75 degrees Celsius. In the SC2 process, the wafers are exposed to an acidic solution of hydrochloric acid and hydrogen peroxide, also at a temperature of around 75 degrees Celsius. The cleaning steps simultaneously etch away the existing oxide coating and reoxidize the surface, resulting in the production of a substantially uniform, thin oxide layer with terminal hydrogen atoms.

After cleaning, the wafers should be contaminated without too much delay to ensure that the surface is as free as possible of undesirable contaminants, such as those that may be present in the air to which the wafers are exposed. Generally, there is a window of approximately 24 hours after cleaning during which a wafer may be contaminated with predictable and reproducible results. To ensure the greatest reproducibility, it is best to allow a predetermined time interval to pass before contaminating the surface, as indicated at 52. The interval should be as short as possible to ensure that the surface is exposed to as few unwanted contaminants as possible. After waiting the predetermined time interval, the wafer may be contaminated as it was in process 38 in FIG. 3. The acid solution is mixed at 40, the solution is applied to the wafer surface at 42, the adsorption process is allowed to equilibrate for a waiting period at 44, and the solution is removed at 46.

Figure 5:
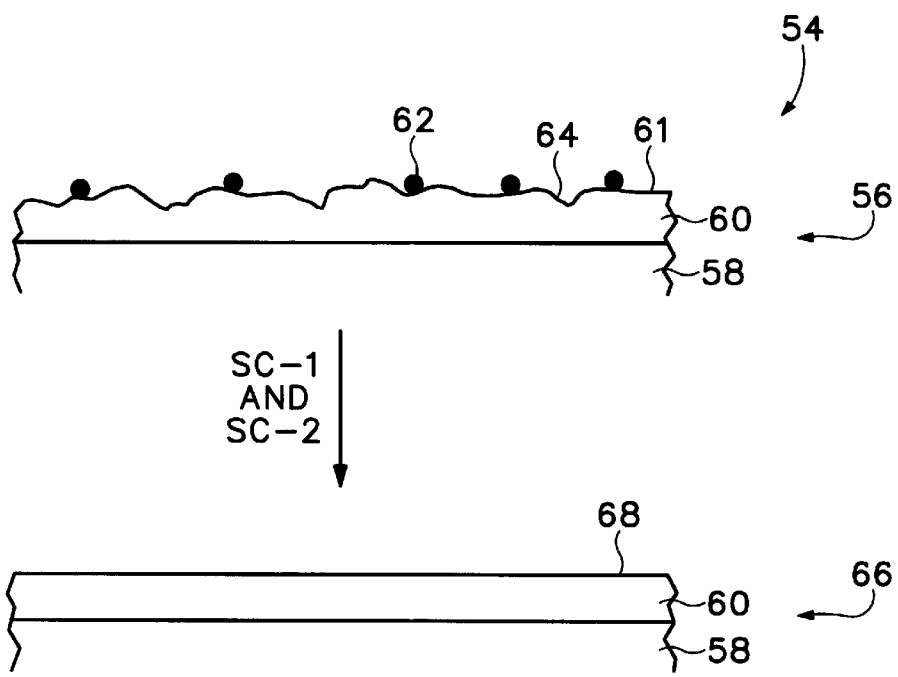
FIG. 5 is a schematic representation of a wafer before and after cleaning.

FIG. 5 shows generally at 54 a simple schematic representation of the surface of a silicon wafer before and after the cleaning step of process 48. A wafer surface before cleaning is indicated at 56. The oxide layer 60 is shown on the surface of the bulk silicon 58. Before cleaning, the surface of the oxide layer 61 is contaminated with various undesirable contaminants, such as the particle shown at 62, and is also very nonuniform, as indicated at 64. The cleaning process etches away the rough oxide layer, and then reoxidizes the underlying silicon once it is exposed by the etching process. The resulting surface is shown at 66. The surface of the new oxide layer, indicated at 68, is extremely uniform and substantially free of contaminants.

Figure 6:
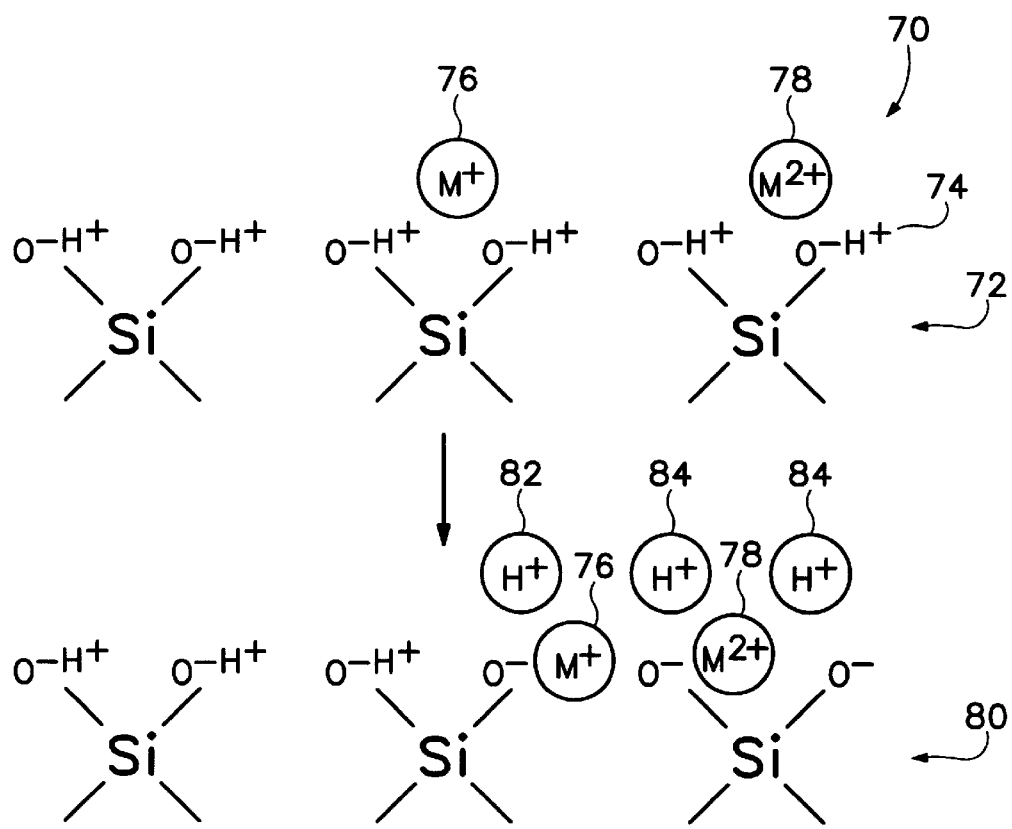
FIG. 6 is a schematic representation of a wafer surface before and after contaminating the wafer surface with a contaminant solution.

FIG. 6 shows generally at 70 a simple atomic-level schematic of the exchange reactions that may take place when the surface of a wafer is exposed to a contaminant solution. The surface of a wafer before any exchange takes place is shown at 72. The surface consists of an oxide layer, with terminal hydrogen ions 74 electrostatically bonded to the oxygen atoms. Two different metals, represented as $M^+$ 76 and $M^{2+}$ 78, are shown. The ratios in which the species are represented in the figure do not represent the actual quantity of each species in the solution or on the surface; the actual concentrations of the metal atoms may be many orders of magnitude lower than the concentration of the acidic species.

At 80, the surface is shown after undergoing two simple adsorption reactions. First, the result of the exchange of an $H^+$ for an $M^+$ reaction is depicted as the simple substitution of the $M^+$ ion 76 for an $H^+$ ion 82. After the exchange, the $M^+$ ion is electrostatically bonded to the surface of the wafer, and the $H^+$ ion is shown free in solution above the wafer surface. Another possible reaction is shown as the exchange of two $H^+$ ions, shown at 84, for a single $M^{2+}$ ion 78. These exchange reactions are relatively low energy physiadsorption reactions. They are readily reversible, and some quantity of contaminant atoms may be removed by the spinning process.

Typically, a concentration gradient is observed across the radius of the wafer after spinning the contaminant solution off, with a higher concentration of contaminant atoms found at the center of the wafer than at the edge. This gradient results from the velocity differential created across the wafer by the spinning process. While being spun dry, the outer edges of the wafer are traveling at a higher rate of speed than the interior portions, resulting in the removal of more contaminant atoms from these regions. The concentration gradient is very reproducible, assuming the same contamination and spinning conditions are used for each wafer. Many other adsorption reactions are possible, including reactions that are not strictly charged balanced when considering only the charges of the surface site and the adsorbing positive ions. These are possible because other charged species, such as counter ions from the acid or metal salt used as a contaminant, are also present in the solution and may themselves adsorb to the surface to neutralize any charge imbalances.

Table 1 summarizes the results of a wafer surface contamination experiment using a solution of nickel. The target contamination of the wafers was to be between $50 \times 10^{10}$ and $100 \times 10^{10}$ atoms/cm$^2$. The solutions were prepared at 450 ppb Ni, and the pH was adjusted over the range from 2.1 to 2.8. Before contaminating the wafers, they were cleaned using SC1 and SC2 chemical baths. Eight-inch wafers were contaminated with each solution within approximately one hour of being cleaned. The solution was removed using a spin processor, and the concentration of nickel adsorbed to the wafer surface was measured using TXRF.

TABLE 1

| Solution | Nickel Concentration (ppb) | pH | Wafer Contamination ($e^{10}$ atoms/cm$^2$) |
| --- | --- | --- | --- |
| 1 | 450 | 2.10 | 61.40 |
| 2 | 450 | 2.48 | 74.13 |
| 3 | 450 | 2.80 | 94.38 |

The results in Table 2 show that the wafer contamination level varies inversely with the acid concentration of the contaminating solution. Furthermore, the results show that the magnitude of contamination can be controlled with extreme sensitivity. Changes of only $20 \times 10^{10}$ atoms/cm$^2$ can be made by adjusting the readily controllable and easily measurable pH.

A similarly precise degree of contamination control can be achieved when contaminating wafers with multiple contaminants. For example, a multi-elemental contaminating solution was prepared as follows: a NIST traceable Graphite Furnace Atomic Absorption (GFAA) standard was provided as a starting solution. The contaminant levels of the GFAA standard are shown in Table 2. The matrix is 2% nitric acid.

TABLE 2

| Element | Concentration (ppb) |
| --- | --- |
| Aluminum | 5,000 |
| Calcium | 2,000 |
| Chromium | 5,000 |

TABLE 2-continued

| Element | Concentration (ppb) |
| --- | --- |
| Copper | 5,000 |
| Iron | 5,000 |
| Sodium | 2,000 |
| Nickel | 5,000 |
| Zinc | 1,000 |

A 100 milliliter multi-elemental contaminating solution was prepared from:
  a) 1 ml of the NIST traceable GFAA standard
  b) 2.5 ml of a solution containing 3 ppm Calcium, 2 ppm Zinc
  c) 3 drops of 70% nitric acid
  d) balance of water The pH of the above multi-elemental contaminating solution is approximately 3.0. A 30 milliliter sample of the solution was applied to 8 inch wafers as described above. Table 3 shows the contaminant concentrations averaged over five test points on the wafer surface, as measured by TXRF.

TABLE 3

| Element | Wafer Contamination ($e^{10}$ atoms/cm$^2$) |
| --- | --- |
| Calcium | 62 |
| Chromium | 7.7 |
| Copper | 12.1 |
| Iron | 15.5 |
| Nickel | 13.6 |
| Zinc | 15.5 |

INDUSTRIAL APPLICATION

This invention is applicable to contamination measurement and control techniques, and is particularly applicable to the controlled contamination of semiconductor substrates.

While the invention has been disclosed in its preferred form, the specific embodiments thereof as disclosed and illustrated herein are not to be considered in a limiting sense as numerous variations are possible. Applicants regard the subject matter of their invention to include all novel and non-obvious combinations and subcombinations of the various elements, features, functions and/or properties disclosed herein. No single feature, function, element or property of the disclosed embodiments is essential to all embodiments.

We claim:

1. A method of preparing a series of contaminated silicon wafers by controllably adding at least one contaminant to a plurality of silicon wafers, the method comprising:

providing a first wafer having a surface with a surface charge;

providing a second wafer having a surface with a surface charge;

providing a first solution containing a first known concentration of the at least one contaminant and having a first pH;

providing a second solution containing a second known concentration of the at least one contaminant and having a second known pH, the second known concentration of the at least one contaminant being substantially the same as the first known concentration of the at least one contaminant;

applying the first solution to the surface of the first wafer;

applying the second solution to the surface of the second wafer;

allowing the first and second solutions to remain on the surfaces of the first and second wafers for a predetermined period of time, so that the surface charges of the surfaces are at least partially controlled by the pHs of the solutions, and so that the at least one contaminant adsorbs to the surfaces in surface concentrations at least partially determined by the surface charges of the surfaces; and removing the first and second solutions while leaving the adsorbed at least one contaminants on the surfaces, such that the first wafer has a first surface concentration of contaminants, and the second wafer has a second surface concentration of contaminants that is different from the first surface concentration of contaminants.

2. The method of claim 1, wherein providing a first solution with a first pH includes providing an aqueous first solution with a first pH.

3. The method of claim 2, wherein providing an aqueous first solution with a first pH includes providing an aqueous first solution with a pH of less than 7.

4. The method of claim 2, wherein providing an aqueous first solution with a first pH includes providing an aqueous first solution with a pH of between 0.5 and 3.

5. The method of claim 2, wherein providing an aqueous first solution with a first pH includes providing an aqueous first nitric acid solution with a first pH.

6. The method of claim 1, wherein applying the first solution to the surface of the first wafer includes applying the solution to the surface of the first wafer with a pipette.

7. The method of claim 1, wherein applying the first solution to the surface of the first wafer includes applying the first solution to the surface of the first wafer so that the first solution covers substantially the whole surface of the first wafer.

8. The method of claim 1, wherein removing the first and second solutions includes removing the solutions by spinning the wafers.

9. The method of claim 1, further comprising cleaning the surface of the first wafer before applying the first solution to the surface.

10. The method of claim 9, further comprising waiting for a predetermined period of time after cleaning the surface before applying the first solution to the surface of the first wafer.

* * * * *

UNITED STATES PATENT AND TRADEMARK OFFICE
CERTIFICATE OF CORRECTION

PATENT NO. : 6,225,136 B1
DATED : May 1, 2001
INVENTOR(S) : Lydon et al.

It is certified that error appears in the above-identified patent and that said Letters Patent is hereby corrected as shown below:

Title page,
Item [56], References Cited, insert the following:
-- U.S. PATENT DOCUMENTS
   4,990,459 02/1991 Maeda et al.
   5,871,812 02/1999 Hwang et al.
   5,841,016 11/1998 Hossain et al.
   5,418,172 05/1995 Falster et al. --.

Item [56], References Cited, PUBLICATIONS, insert the following:
-- Journal of The Electrochemical Society, 146(6), pages 2245-2253 (1999) "Calibrated Contamination Spiking Method for Silicon Wafers in the $10^{10}$ - $10^{12}$ Atom/cm$^2$ Range".
The Journal of Physical Chemistry, Volume 68, Number 4, April 1964, pages 757-760, "The Exchange of Twenty Metal Ions with the Weakly Acidic Silanol Group of Silica Gel".
J. Electroanal. Chem., 17, 1968 (pages 267-275), "Adsorption of Potential-Determining Ions at the Silica-Aqueous Electrolyte Interface and the Role of Some Cations".
J. Electroanal Chem., 22, 1969 (pages 1-7), "The Electrical Double Layer on Silica in the Presence of Bivalent counter-Ions".
Analytical Sciences, June 1995, Vol. 11, (pages 511-513), "A Review of Standardization Issues for Total Reflection X-Ray Fluorescence and Vapor Phase Decomposition/Total Reflection X-Ray Fluorescence".

UNITED STATES PATENT AND TRADEMARK OFFICE
CERTIFICATE OF CORRECTION

PATENT NO. : 6,225,136 B1
DATED : May 1, 2001
INVENTOR(S) : Lydon et al.

It is certified that error appears in the above-identified patent and that said Letters Patent is hereby corrected as shown below:

<u>Journal of Colloid and Interface Science</u>, 190, pages 212-223 (1997), "The Effect of the Ionic Strength on the Adsorption Isotherms of Nickel on Silica". --.

Signed and Sealed this

Nineteenth Day of February, 2002

*Attest:*

JAMES E. ROGAN
*Attesting Officer*  *Director of the United States Patent and Trademark Office*